(12) United States Patent
Kellerman et al.

(10) Patent No.: US 7,598,495 B2
(45) Date of Patent: Oct. 6, 2009

(54) METHODS AND SYSTEMS FOR TRAPPING ION BEAM PARTICLES AND FOCUSING AN ION BEAM

(75) Inventors: Peter L. Kellerman, Essex, MA (US);
Victor M. Benveniste, Lyle, WA (US);
Alexander S. Perel, Danvers, MA (US);
Brian S. Freer, Medford, MA (US);
Michael A. Graf, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 334 days.

(21) Appl. No.: 11/739,934

(22) Filed: Apr. 25, 2007

(65) Prior Publication Data

US 2007/0295901 A1     Dec. 27, 2007

Related U.S. Application Data

(60) Provisional application No. 60/794,947, filed on Apr. 26, 2006.

(51) Int. Cl.
*H01J 3/18* (2006.01)

(52) U.S. Cl. .................. 250/396 R; 250/492.2; 250/492.21

(58) Field of Classification Search ............. 250/396 R, 250/492.21, 492.2, 492.22; 355/67
See application file for complete search history.

(56) References Cited

U.S. PATENT DOCUMENTS 3,955,091 A    5/1976    Robinson et al.

(Continued)

FOREIGN PATENT DOCUMENTS

FR          1042046 A    10/1953

(Continued)

OTHER PUBLICATIONS

Search Report issued on Feb. 8, 2008 in connection with International Application No. PCT/US2007/009272 with a filing date of Apr. 13, 2007.

*Primary Examiner*—Nikita Wells
*Assistant Examiner*—Johnnie L Smith
(74) *Attorney, Agent, or Firm*—Eschweiler & Associates, LLC

(57) ABSTRACT

A focusing particle trap system for ion implantation comprising an ion beam source that generates an ion beam, a beam line assembly that receives the ion beam from the ion beam source comprising a mass analyzer that selectively passes selected ions, a focusing electrostatic particle trap that receives the ion beam and removes particles from the ion beam comprising an entrance electrode comprising an entrance aperture and biased to a first base voltage, wherein the first surface of the entrance electrode is facing away from a center electrode and is approximately flat, wherein the second surface of the entrance electrode is facing toward the center electrode and is concave, wherein the center electrode is positioned a distance downstream from the entrance electrode comprising a center aperture and biased to a center voltage, wherein the center voltage is less than the first base voltage, wherein the first surface of the center electrode is facing toward the entrance electrode and is convex, wherein the second surface of the center electrode is facing away from the entrance electrode and is approximately flat, an exit electrode positioned a distance downstream from the center electrode comprising an exit aperture and biased to a second base voltage, and wherein the first surface of the exit electrode is facing toward the center electrode and is approximately flat, wherein the second surface of the exit electrode is facing away from the center electrode and is approximately flat, wherein a first electrostatic field is generated from the entrance electrode toward the center electrode and a second electrostatic field is generated from the exit electrode toward the center electrode; wherein the second base voltage is greater than the center voltage, and an end station that is downstream from the beam line assembly and receives the ion beam.

33 Claims, 10 Drawing Sheets

U.S. PATENT DOCUMENTS

| | | | |
|---|---|---|---|
| 5,483,077 A * | 1/1996 | Glavish | 250/492.2 |
| 5,780,863 A | 7/1998 | Benveniste et al. | |
| 6,489,622 B1 | 12/2002 | Chen et al. | |
| 6,525,326 B1 | 2/2003 | Harrington et al. | |
| 6,534,775 B1 | 3/2003 | Harrington et al. | |
| 6,774,377 B1 | 8/2004 | Rathmell et al. | |
| 6,998,625 B1 | 2/2006 | McKenna et al. | |
| 7,421,677 B2 * | 9/2008 | Hansen et al. | 716/21 |
| 2004/0207829 A1 * | 10/2004 | Hansen et al. | 355/67 |
| 2006/0113493 A1 * | 6/2006 | Kabasawa et al. | 250/492.21 |
| 2008/0078951 A1 * | 4/2008 | Renau et al. | 250/492.21 |
| 2009/0121149 A1 * | 5/2009 | Radovanov et al. | 250/396 R |

FOREIGN PATENT DOCUMENTS

| | | |
|---|---|---|
| JP | 4118842 A | 4/1992 |
| JP | 7211497 A | 8/1995 |
| JP | 10241616 A | 9/1998 |
| JP | 3081965 B2 | 8/2000 |
| WO | WO 2005/038855 A | 4/2005 |

\* cited by examiner

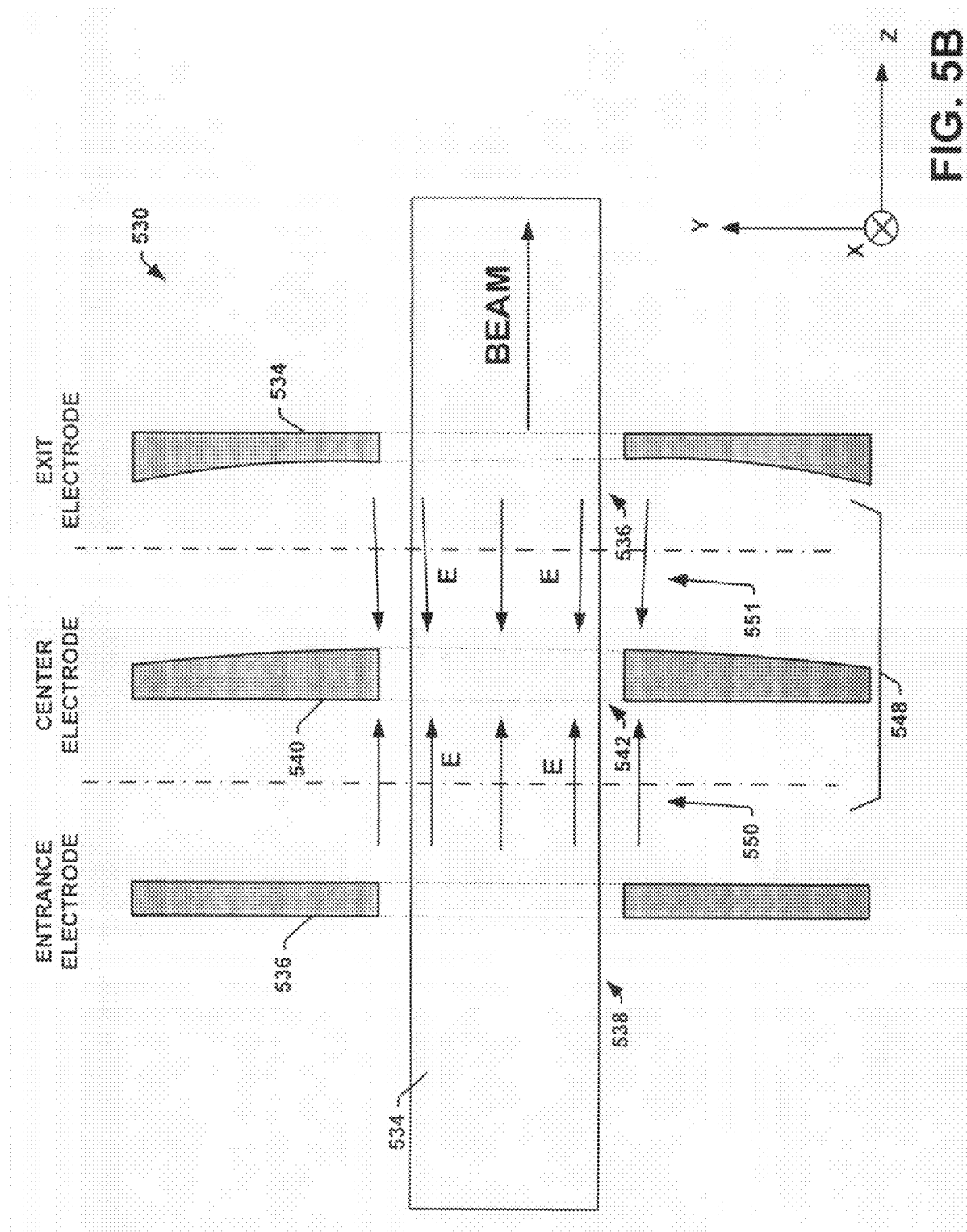

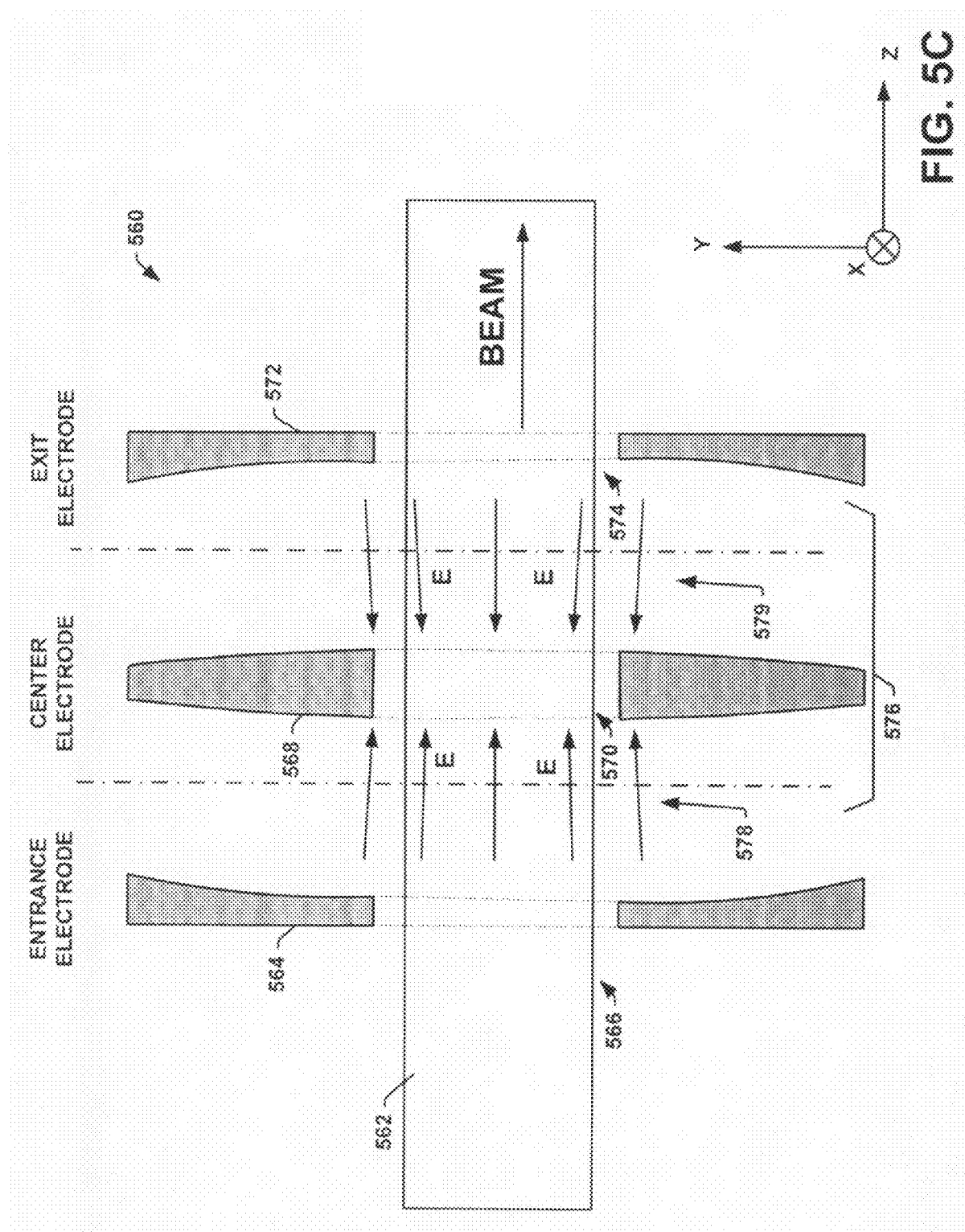

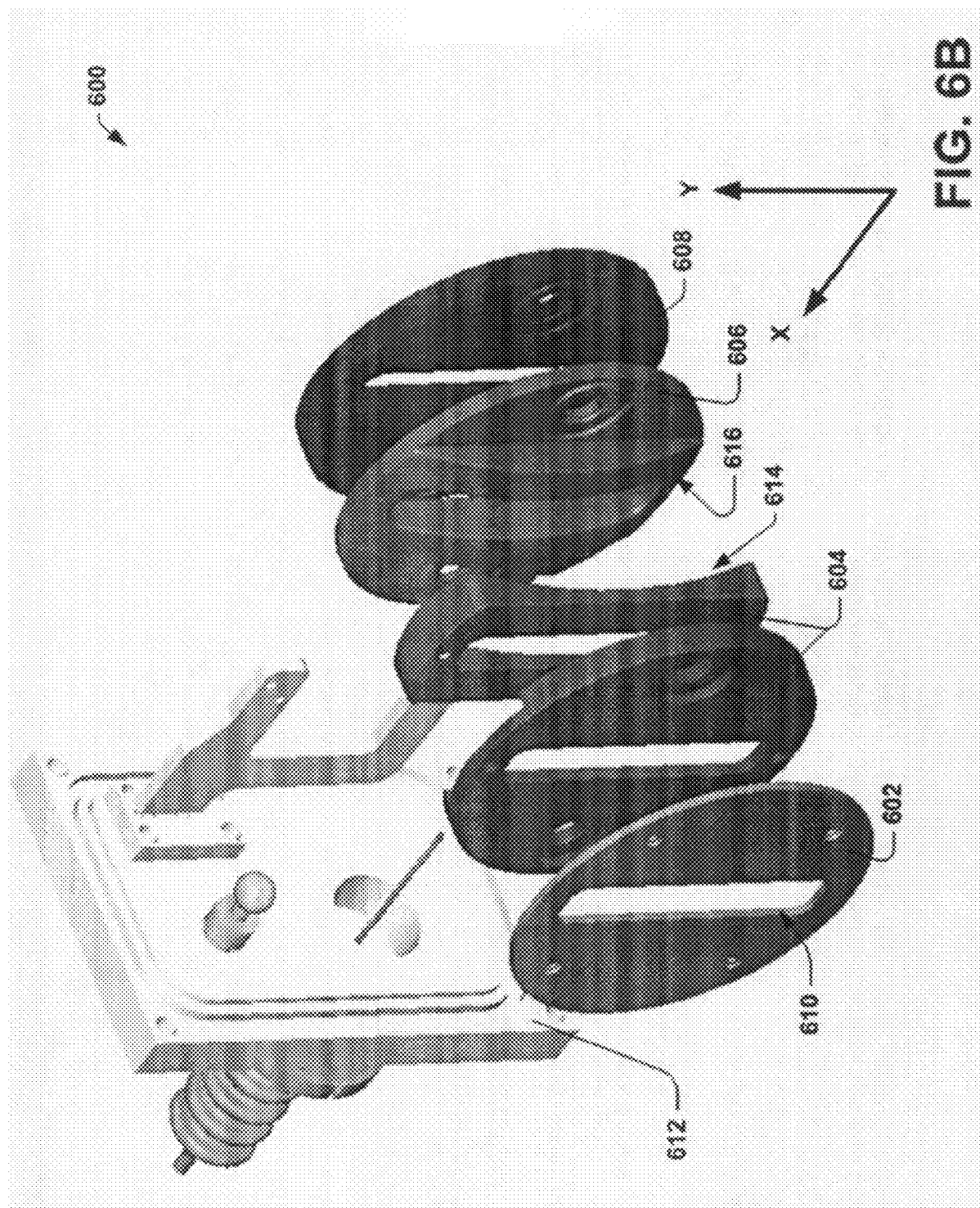

METHODS AND SYSTEMS FOR TRAPPING ION BEAM PARTICLES AND FOCUSING AN ION BEAM

REFERENCE TO RELATED APPLICATION

This application claims priority to and the benefit of U.S. Provisional Application Ser. No. 60/794,947 which was filed Apr. 26, 2006, entitled METHODS AND SYSTEMS FOR TRAPPING ION BEAM PARTICLES AND FOCUSING AN ION BEAM, the entirety of which is hereby incorporated by reference as if fully set forth herein.

FIELD OF INVENTION

The present invention relates generally to ion implantation typically employed in semiconductor device fabrication, and more particularly, to trapping ion beam particles away from ion beams and focusing ion beams.

BACKGROUND OF THE INVENTION

Ion implantation is a physical process that is employed in semiconductor device fabrication to selectively implant dopant into semiconductor and/or wafer material, as well for materials modification such as amorphization and SOI. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their ionic energy.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field, for example. The radius of the arc is dictated by the mass of individual ions, speed, and the strength of the magnetic field. An exit of the analyzer permits only one species of ions, the desired dopant ions, to exit the mass analyzer.

An acceleration/deceleration system is employed to accelerate or decelerate the desired dopant ions to a predetermined momentum (e.g., mass of a dopant ion multiplied by its velocity) to penetrate the wafer surface. For acceleration, the system is generally of a linear design with annular powered electrodes along its axis. As the dopant ions enter therein, they are accelerated therethrough.

Operation of an ion implantation system or other ion beam equipment (e.g., linear accelerators) may result in the production of contaminant particles. The contaminant particles, for example, may be less than about 1 micro-meter in size. The momentum of the ions in the beam that strike the particles, in turn, cause the particles to be transported with the beam, although typically at a speed much less than the ions. Consequently, particles entrained in an ion beam may be transported with the beam toward the wafer (or other substrate), resulting in undesired contamination at the wafer.

In an ion implantation system, for example, one source of contaminant particles is photoresist material. Photoresist material is coated on wafer surfaces prior to implantation and is utilized to define circuitry on the completed integrated circuit. As ions strike the wafer surface, particles of photoresist may be dislodged from the wafer and may become entrained in the ion beam. Contaminant particles that collide with and adhere to a semiconductor wafer or other substrate during ion implantation may be a source of yield loss in the fabrication of semiconductor and other devices that require submicroscopic pattern definition on the treated wafers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates ion implantation processes and systems by removing particles from an ion beams while focusing ion beams during ion implantation processes. Ion beam particles are unwanted particles that can become present within the ion beams. These particles, if not removed, are transported by the ion beam to the wafer, where they can cause damage or have undesirable effects on implantation or subsequent processing. Thus, the present facilitates filtering particles from ion beams without substantially losing beam current, such as due to downstream apertures. As a result, a focused ion beam having fewer unwanted particles can be obtained.

A focusing particle trap system for ion implantation removes unwanted particles from an ion beam prior to implantation. An entrance electrode comprising an entrance aperture and is biased to a first base voltage. A center electrode is positioned a distance downstream from the entrance electrode and includes a center aperture. The center electrode is biased to a center voltage, less than, or more negative than, the first base voltage. An exit electrode is positioned a distance downstream from the center electrode and includes an exit aperture. The exit electrode is biased to a second base voltage, for example, greater than, or less negative than, the center electrode voltage. A first electrostatic field is generated from the entrance electrode toward the center electrode and a second electrostatic field is generated from the exit electrode toward the center electrode in order to trap unwanted particles within an ion beam. Other systems, methods, and detectors are also disclosed.

According to another aspect of the invention, an ion implantation system is disclosed comprising an ion beam source that generates an ion beam, a beam line assembly that receives the ion beam from the ion beam source comprising a mass analyzer that selectively passes selected ions, a focusing electrostatic particle trap that receives the ion beam and removes particles from the ion beam comprising an entrance electrode comprising an entrance aperture and biased to a first base voltage, wherein the first surface of the entrance electrode is facing away from a center electrode and is approximately flat, wherein the second surface of the entrance electrode is facing toward the center electrode and is concave, wherein the center electrode is positioned a distance downstream from the entrance electrode comprising a center aperture and biased to a center voltage, wherein the center voltage is less than the first base voltage, wherein the first surface of the center electrode is facing toward the entrance electrode and is convex, wherein the second surface of the center electrode is facing away from the entrance electrode and is approximately flat, an exit electrode positioned a distance downstream from the center electrode comprising an exit aperture and biased to a second base voltage, and wherein the first surface of the exit electrode is facing toward the center electrode and is approximately flat, wherein the second surface of the exit electrode is facing away from the center electrode and is approximately flat, wherein a first electrostatic field is generated from the entrance electrode toward the center electrode and a second electrostatic field is generated from the exit electrode toward the center electrode, wherein the second base voltage is greater than the center voltage, and an end station that is downstream from the beam line assembly and receives the ion beam.

According to yet another exemplary aspect of the invention, a focusing particle trap system is disclosed for ion implantation comprising an entrance electrode comprising an entrance aperture and biased to a first base voltage, a center electrode positioned a distance downstream from the entrance electrode comprising a center aperture and biased to a center voltage, an exit electrode positioned a distance downstream from the center electrode comprising an exit aperture and biased to a second base voltage, wherein the first base voltage and the second base voltage are greater than the center voltage, and wherein a first electrostatic field is generated from the entrance electrode toward the center electrode and a second electrostatic field is generated from the exit electrode toward the center electrode, wherein the first surface of the entrance electrode is facing away from a center electrode and is approximately flat, wherein the second surface of the entrance electrode is facing toward the center electrode and is concave, wherein the first surface of the center electrode is facing toward the entrance electrode and is convex, wherein the second surface of the center electrode is facing away from the entrance electrode and is approximately flat, wherein the first surface of the exit electrode is facing toward the center electrode and is approximately flat, and wherein the second surface of the exit electrode is facing away from the center electrode and is approximately flat.

According to another embodiment, a method of focusing an ion beam and trapping particles within the ion beam comprising providing an ion beam having particles and ions within the ion beam, focusing the ion beam within a first focus region, defocusing the ions within the ion beam within a defocus region, trapping the particles within the defocus region by defocusing the particles of the ion beam to remove the particles from the ion beam, and focusing mainly the ions of the ion beam within a second focus region.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5B is another cross sectional view of a focusing particle trap in accordance with another aspect of the present invention.

FIG. 5C is a cross sectional view of another focusing particle trap in accordance with yet another aspect of the present invention.

FIG. 6B is an exploded perspective view of a focusing particle trap in accordance with an aspect of the present invention.

DETAILED DESCRIPTION OF THE INVENTION

Figure 1:
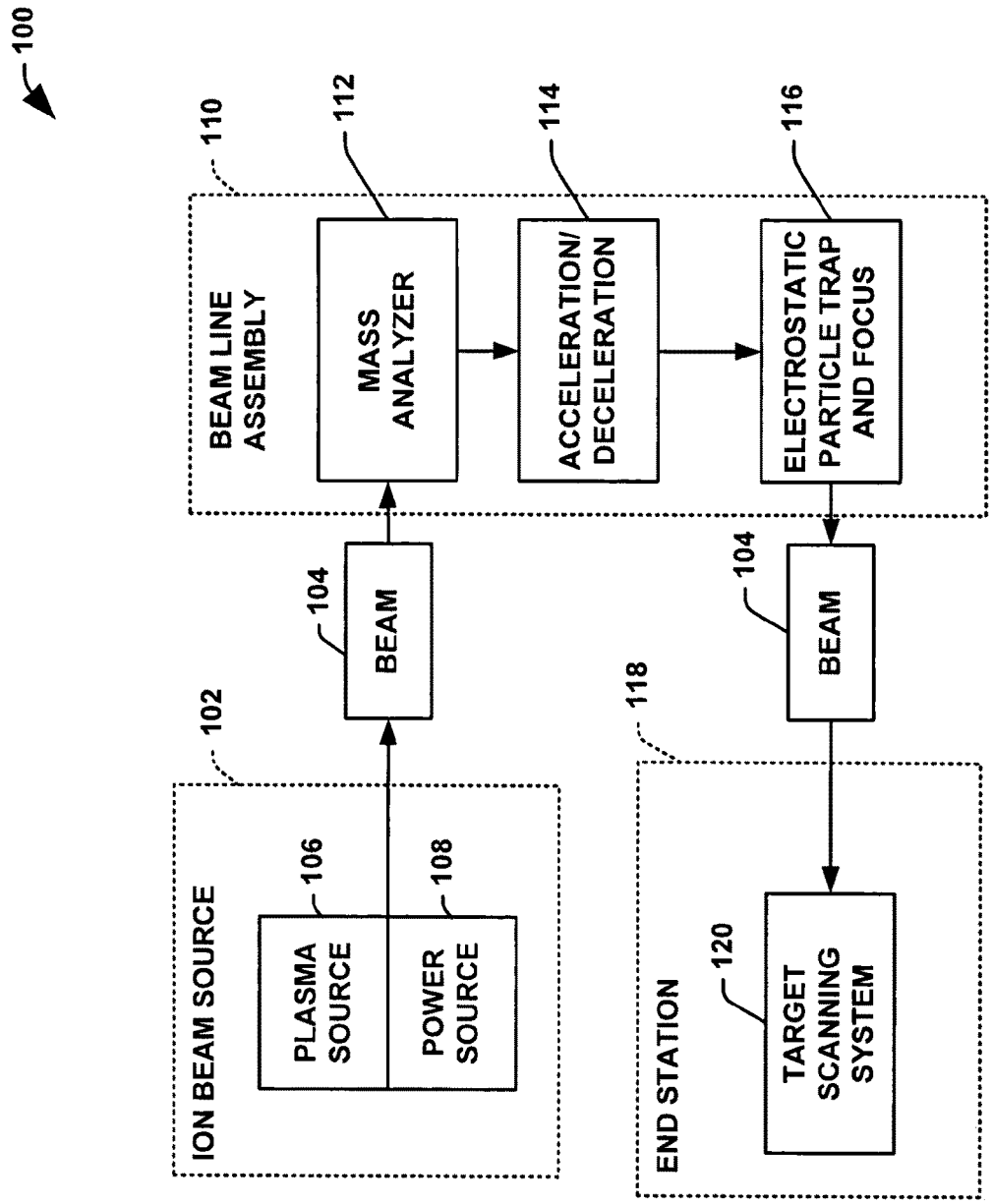
FIG. 1 is an ion implantation system suitable for implementing one or more aspects of the present invention is depicted in block diagram form.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates ion implantation processes and systems by removing particles from an ion beams while focusing ion beams during ion implantation processes. Ion beam particles are unwanted particles that can become present within ion beams. These particles, if not removed, are transported by the ion beam to the wafer, where they can cause damage or have undesirable effects on implantation or subsequent processing. Thus, the present invention facilitates filtering particles from ion beams without substantially losing beam current, such as due to downstream apertures. As a result, a focused ion beam having less unwanted particles can be obtained.

Referring initially to FIG. 1, an ion implantation system 100 suitable for implementing one or more aspects of the present invention is depicted in block diagram form. The system 100 includes an ion beam source 102 for producing an ion beam 104 along a beam path. The ion beam source 102 includes, for example, a plasma source 106 with an associated power source 108. The plasma source 106 may, for example, comprise a relatively long plasma confinement chamber from which the ion beam 104 is extracted.

A beam line assembly 110 is provided downstream of the ion source 102 to receive the beam 104 therefrom. The beam line assembly 110 includes a mass analyzer 112, an acceleration structure 114, which may optionally include, for example, one or more gaps, and an angular energy filter referred to as an electrostatic particle trap 116. The beam line assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The acceleration gap or gaps within the acceleration structure 114 are operable to accelerate and/or decelerate ions within the beam 104 to achieve a desired depth of implantation in a workpiece. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means may be applied before as well as after the magnetic analysis by the mass analyzer 112.

It is appreciated that contaminating particles may be produced within the ion beam 104 by collisions among ions and background or residual particles. Such encounters can cause some of the ions to transfer their momentum and charge to the particles and cause the particles to move toward the target. If the particles reach the target, they can interfere with the implantation being performed, or with subsequent processing steps, or cause damage to the surface of the target, including structures previously formed on the target.

The particles of concern at the time of application are typically on the order of 0.05 to 10 micro-meters in diameter and/or width and can contain thousands to millions of atoms, for example. If a particle enters the ion beam 104, ions within the beam 104 impact the particle and give the particle momentum in the same direction as the beam path. Prior to entering the particle trap 116, the particles do not have a high net positive charge because there are sufficient numbers of electrons also present within the ion beam 104 that balance, negate or prevent the buildup of positive charge on the particles.

An electrostatic particle trap and focusing component 116 receives the accelerated/decelerated ion beam 104 from the acceleration gap(s) 114 and selectively horizontally focuses the ion beam 104 and excludes or removes unwanted particles from the ion beam 104.

The particle trap 116 includes an entrance horizontal focus region, a horizontal de-focus region, and a horizontal exit focus region. Electrons within the beam 104 are repelled by a negatively biased center electrode which allows the particles to build up a positive charge. The ion beam 104, including unwanted particles, passes through the entrance focus region. Then, the ion beam 104 passes through the de-focus region, which slightly defocuses the ion beam 104, which then propagates to the exit focus region, which selectively focuses the ion beam 104. The particles within the ion beam 104 continue to accumulate positive charge. As a result, the de-focus region deflects the particles to a greater extent than the ions and prevents them from leaving the de-focus region with the rest of the ion beam 104. The particles orbit within the de-focus region and continuously build up positive charge until impacting upon an object, such as an electrode, for example. It should be appreciated the terms "horizontal" and "vertical" are used with respect to the focus/defocus regions and the lens curvature. These terms should not be taken in a limiting sense, rather the terms indicate that the forces exhibited by focus/defocus regions and the lens surfaces are perpendicular to each other.

The particle trap 116 includes a number of electrodes that establish the focus and de-focus regions. In some aspects, the electrodes or a portion of the electrodes can be shaped so as to mitigate divergence of the beam in one or more directions.

Positively charged ions which form the ion beam repulse each other because of a so-called "space-charge force". Space-charge effects increase with decreasing ion beam energy, and thus may increase as the ions in the beam are decelerated, making the beam more prone to dispersal or blow up. Because of the space-charge force, the lateral spread of an ion beam is proportional to:

$$(\sqrt{m}/\sqrt{q}) \times (Iz^2/U^{3/2})$$

where m is an ion mass, q is an ion charge, I is a beam current, U is beam energy, and z is the traveling distance of the ion beam 104, assuming that the ion beam 104 is uniform and has a circular cross section. Thus, it can be appreciated that the likelihood of beam blow up increases as the distance that the beam 104 travels increases. Accordingly, if an ion beam 104 travels over a long distance to a wafer, it becomes more difficult for all ions to reach the wafer, particularly where there is a large beam current or concentration of ions within the beam 104.

It is noted that the particle trap 116 is depicted as a separate component within the beamline assembly 110. However, it is appreciated that alternate aspects of the present invention contemplate other arrangements and configurations, for example wherein the particle trap 116 is a part of the acceleration component 114.

An end station 118 is also provided in the system 100 to accept the ion beam 104 from the beamline assembly 110. The end station 118 supports one or more workpieces such as semiconductor wafers (not shown) along the beam path for implantation using the mass analyzed ion beam 104. The end station 118 includes a target scanning system 120 for translating or scanning one or more target workpieces and the ion beam 104 relative to one another. The target scanning system 120 may provide for batch or serial implantation, for example, as may be desired under given circumstances, operating parameters and/or objectives.

Figure 2:
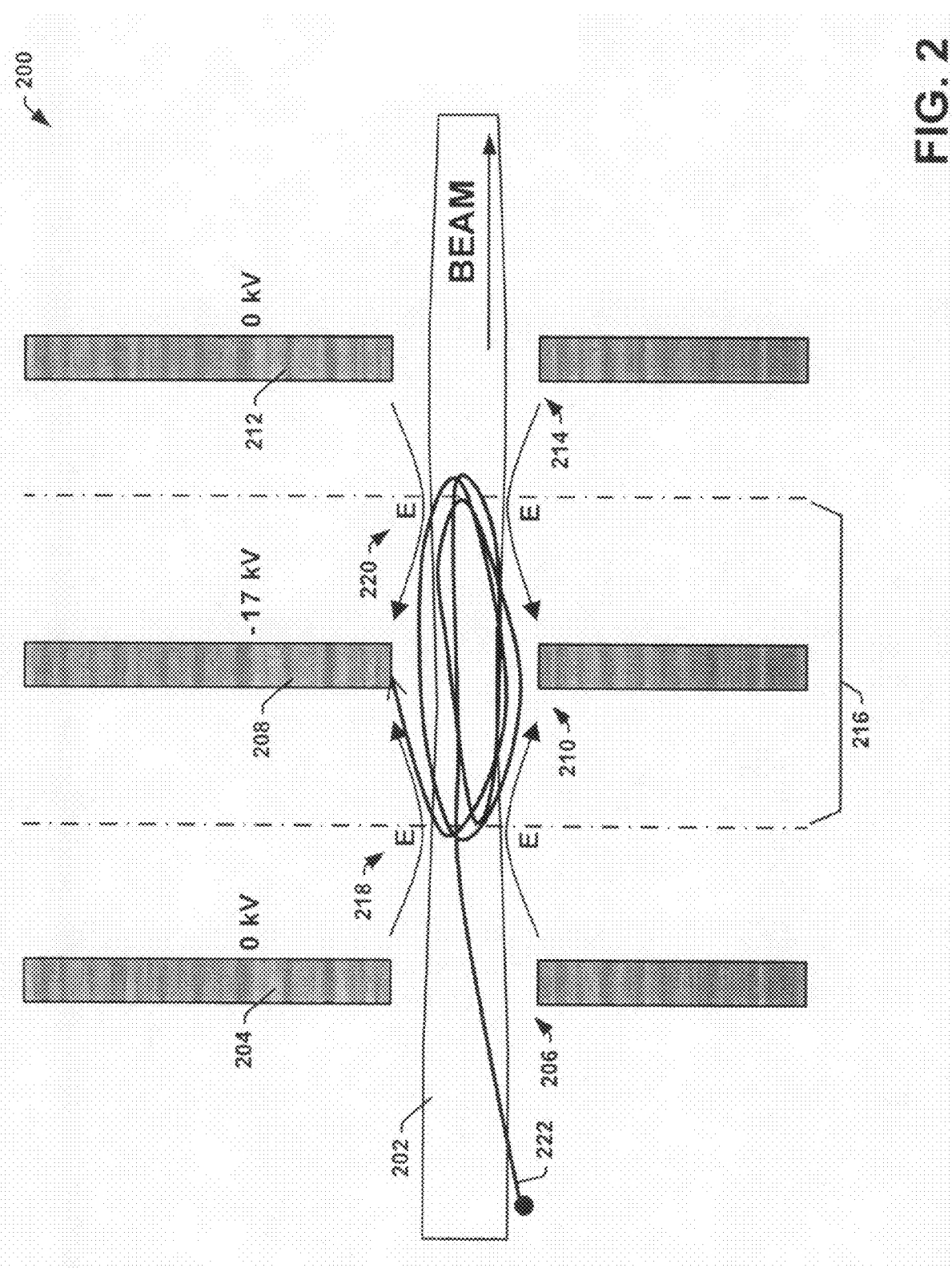
FIG. 2 is a cross sectional view of a focusing particle trap in accordance with an aspect of the present invention.

FIG. 2 is a cross sectional view of a focusing particle trap 200 in accordance with an aspect of the present invention. The particle trap 200 is operable on ion beams, such as an exemplary ion beam 202, and selectively removes particles from the ion beam 202 while also focusing the ion beam 202 in order to mitigate space charge blow up, and the like. The focusing particle trap 200 is exemplary in nature and it is appreciated that variations thereof are contemplated and in accordance with the present invention.

The particle trap 200 comprises an entrance electrode 204, a center electrode 208, and an exit electrode 212, for example. The entrance electrode 204 is comprised of a conductive material and comprises an entrance aperture 206 through which the exemplary ion beam 202 travels. The aperture 206 is shaped such that the ion beam 202 can substantially pass there through. The entrance electrode 204 is biased to a lower in magnitude or more positive voltage than the center electrode 208, such as ground or 0 V, for example.

The center electrode 208 is positioned downstream of the entrance electrode 204 and is also comprised of a conductive material and comprises a center aperture 210 through which the exemplary ion beam 202 travels after passing through the entrance aperture 206. The center electrode 208 can be biased to a negative voltage, such as −17 kV, less than that of the entrance electrode 204, for example. As a result, a first electric field 218 is created directed from the entrance electrode 204 toward the center electrode 208. The first electric 218 field initially focuses the ion beam 202, but then defocuses the ion beam 202 at about halfway from the entrance electrode 204 to the center electrode 208, for example.

The exit electrode 212 is positioned downstream of the center electrode 208 and is substantially parallel to both the center electrode 208 and the entrance electrode 204, for example. Additionally, the exit electrode 212 is comprised of a conductive material and comprises an exit aperture 214 through which the exemplary ion beam 202 travels after passing through the center aperture 210. The exit electrode 212 can be biased to a more positive value, such as ground or zero volts, for example. As a result, a second electric field 220 is generated directed from the exit electrode 212 towards the center electrode 208, for example. The second electric field 220 initially causes the ions and particles within the beam (having a positive charge) to slow and defocus from a central axis. At about a halfway point between the center electrode 208 and the exit electrode 212, the second electric field 220 focuses the ion beam 202, for example.

The ion beam 202 is comprised of positively charged ions in this exemplary aspect. Additionally, unwanted particles are also contained within the ion beam 202. The particles are typically and initially approximately neutral and relatively stationary and also are generally larger than ions within the ion beam by orders of magnitude. As positively charged ions collide with the particles, the particles tend to move downstream in the direction of the ion beam 202. The velocity of the unwanted particles is still substantially less than the velocity of the ions within the ion beam 202.

When a particle passes through the entrance electrode 204, it continues to be struck by positive ions. In this region, electrons are repelled by the negative electrode, and positive charge builds up on the particle. The particle is accelerated by the longitudinal component of the electric field between the entrance 204 and center electrode 208. When a particle passes the center electrode 208, it is decelerated by the longitudinal component of the field between the center electrode 208 and the exit electrode 212. Since the charge on the particle continues to become more positive, the effect of the field of the negatively biased center electrode 208 is greater on the exit side than it had been on the entrance side. As a result, the deceleration of the particle is greater than the acceleration, and the motion of the particle is reversed. This cycle is repeated as the particle moves back toward the entrance electrode 204, and so on. The particle is therefore trapped in the region near the center electrode 208.

In addition, the particles are trapped primarily in a defocus region 216 that extends from halfway between the entrance electrode 204 and the center electrode 208 to halfway between the center electrode 208 and the exit electrode 212. In this region, the lateral component of the electric field is outward from the center. The ions are slightly defocused within this region, but the particles are greatly defocused due to their longer residence time. As a result, the particles divert away from a central axis of propagation for the ion beam 202 and can orbit one or more times within the defocus region until impacting against an object, such as the center electrode 208.

As an example, a single exemplary particle 222 is depicted entering the ion beam 202 and being moved downstream with the ion beam 202, for example. Upon entering the ion beam 202, the particle 222 becomes more positively charged. Upon entering the defocus region 216, the particle 222 is drawn towards the negatively biased center electrode 208. The particle 222, in this example, continues past the center electrode 208 due to its velocity, but eventually reverses direction toward the center electrode 208. The particle 222 then continues to orbit about the defocus region 216 until impacting upon an object, such as the center electrode 208, for example.

Figure 3A:
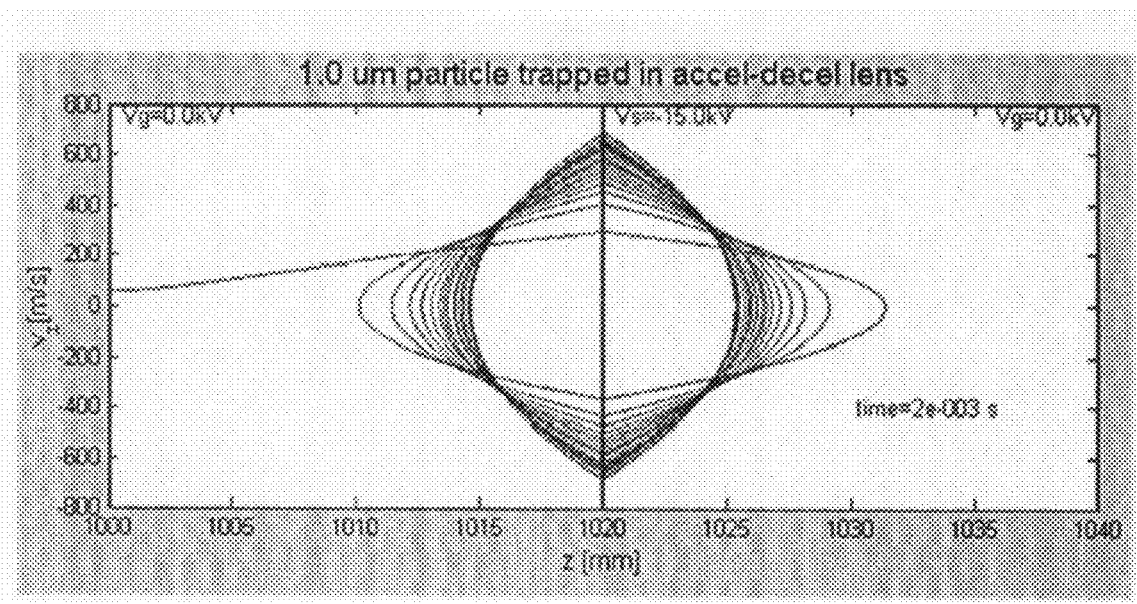
FIG. 3A is a graph of an exemplary simulation of a particle traveling about a defocus region of a particle trap in accordance with an aspect of the present invention.

FIG. 3A is a graph 301 of an exemplary simulation of a particle traveling about a defocus region of a particle trap in accordance with an aspect of the present invention. The particle trap is similar in configuration and operation to the particle trap 200 of FIG. 2. The graph 301 depicts simulation results and is provided to facilitate understanding of the present invention and not to limit the present invention to particular values or characteristics depicted therein.

The graph 301 depicts velocity with respect to position for a 1 micro-meter sized particle trapped within the defocus region. A center electrode is biased to −15.0 kV and entrance and exit electrodes are biased to ground (0 V), for example. An x-axis represents distance in millimeters and a y-axis represents velocity in meters per second. For this example, the entrance electrode is located at about 1000 mm, the center electrode at about 1020 mm, and the exit electrode at about 1040 mm. The duration of the particle within the trap is about 0.002 seconds, for example.

Initially, for example, the particle is at a relatively low velocity (less than 100 m/s). Upon entering the particle trap, it can be seen that its velocity changes substantially due to the electric fields generated by the various electrodes and its attraction toward the negatively biased center electrode (e.g., 208 of FIG. 2). Eventually, the particle impacts upon an object, such as the center electrode and loses its positive charge.

Figure 3B:
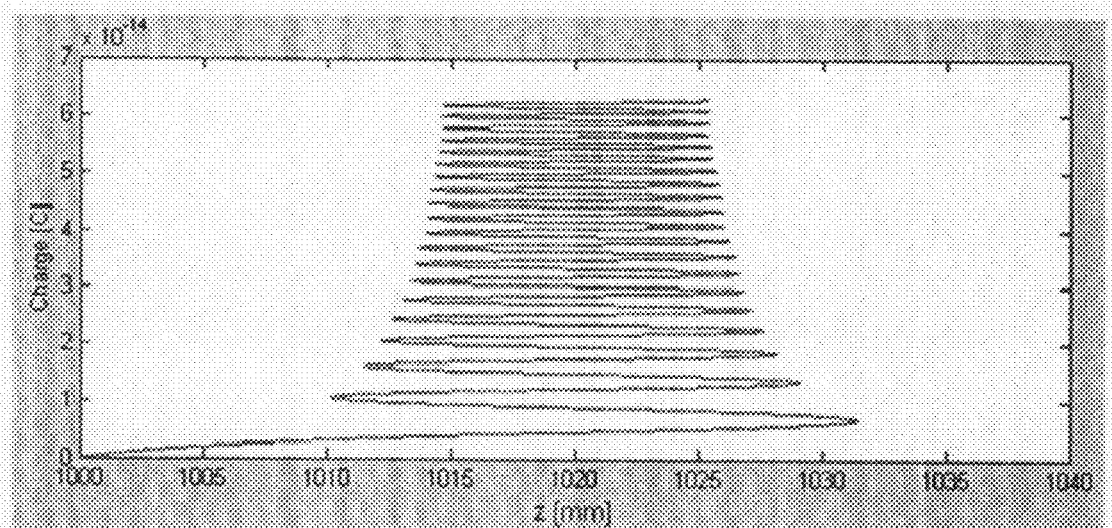
FIG. 3B is another graph of an exemplary simulation of the particle traveling about a defocus region of a particle trap in accordance with an aspect of the present invention.

FIG. 3B is another graph 302 of an exemplary simulation of the particle traveling about a defocus region (e.g., 216 of FIG. 2) of a particle trap in accordance with an aspect of the present invention. The simulation is already described with respect to FIG. 3A. Here, the graph 302 depicts charge with respect to position for a 1 micro-meter sized particle trapped within the defocus region. A center electrode is biased to −15.0 kV and entrance and exit electrodes are biased to ground (0 V). An x-axis represents distance in millimeters and a y-axis represents charge. For this example, the entrance electrode is located at about 1000 mm, the center electrode at about 1020 mm, and the exit electrode at about 1040 mm. Initially, the particle has a relatively low positive charge, but its charge steadily increases while within the trap.

Figure 4:
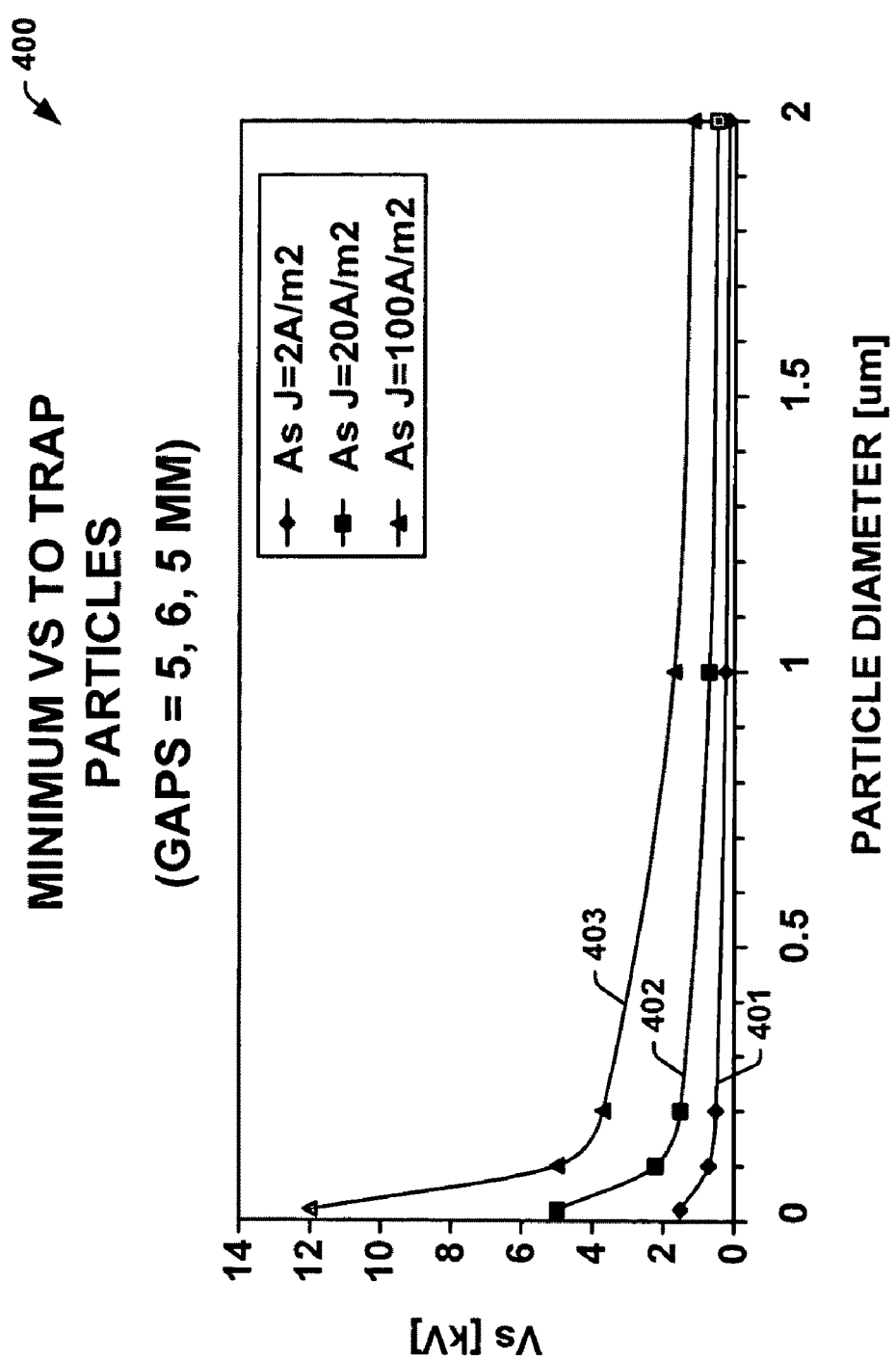
FIG. 4 is a graph illustrating minimum center electrode voltages for trapping particles with a particle trap in accordance with an aspect of the present invention.

FIG. 4 is a graph 400 illustrating minimum center electrode voltages for trapping particles with a particle trap in accordance with an aspect of the present invention. The particle trap is similar in configuration and operation to the focusing particle trap 200 of FIG. 2. The graph 400 depicts simulation results and is provided to facilitate understanding of the present invention and not to limit the present invention to particular values or characteristics depicted therein.

A center electrode (208 of FIG. 2) is biased to a negative voltage and entrance (204 of FIG. 2) and exit electrodes (212 of FIG. 2) are biased to ground. Additionally, gaps between the electrodes are about 4 mm, for example. An x-axis represents particle diameter in micro-meters and a y-axis represents a magnitude of a negative voltage bias (kV) applied to the center electrode of the particle trap.

A first line 401 represents unwanted particles within an ion beam, wherein the beam has a current density of about 2 Amps per square meter for arsenic ions within the beam. Generally, smaller particles require larger negative bias values (in magnitude), whereas larger particles require lower negative bias values. Here, it can be seen that even relatively small particles, less than 0.1 micro-meters can be trapped with relatively small voltages (e.g., less than about 2 kV). A second line 402 represents particles within an ion beam and at a current density of about 20 Amps per square meter. The higher current density requires a larger negative bias, about 4 kV for smaller particle diameters. A third line 403 represents particles within an ion beam and at a current density of about 200 Amps per square meter. This even higher current density requires an even larger negative bias voltage.

Figure 5A:
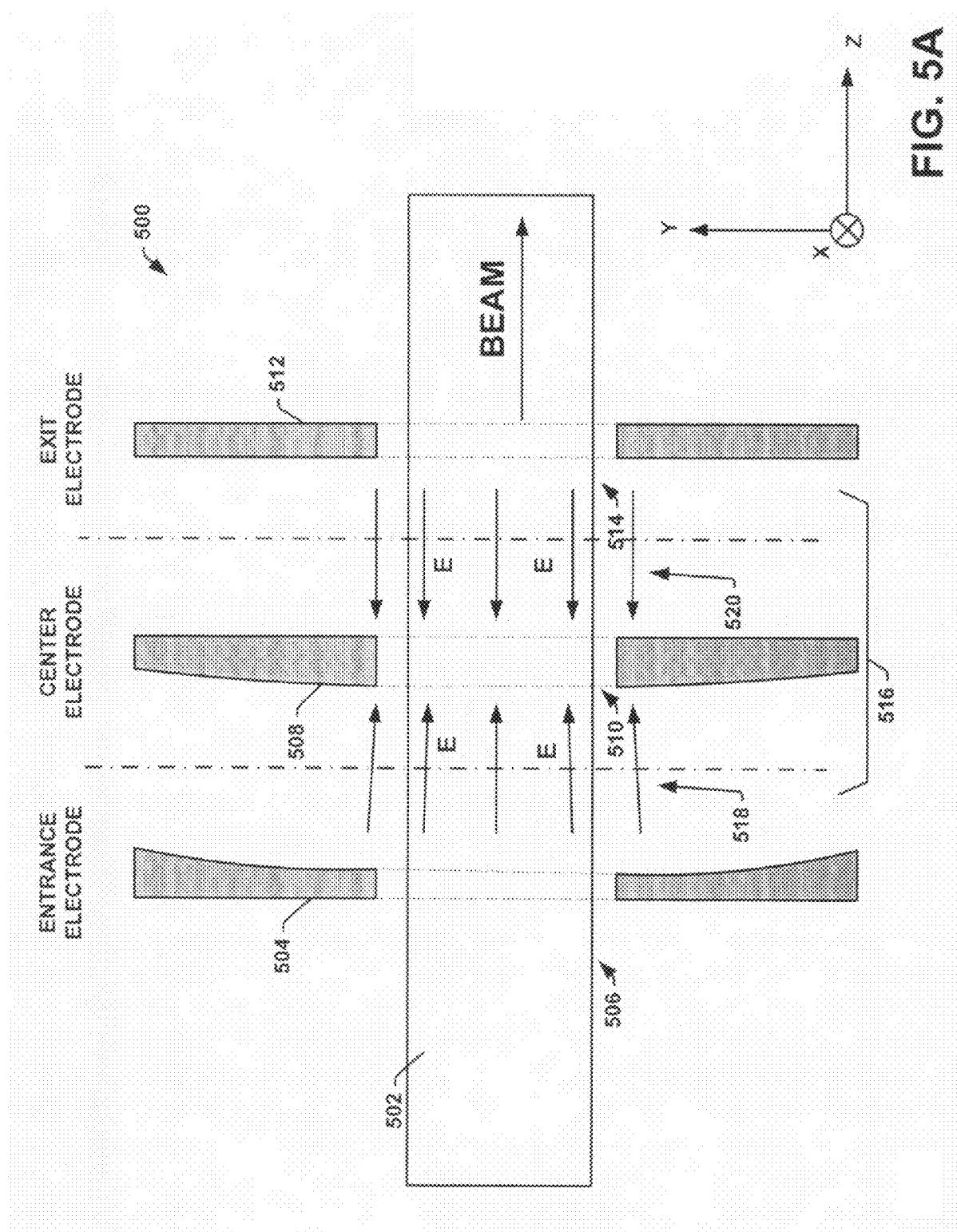
FIG. 5A is a cross sectional view of another focusing particle trap in accordance with an aspect of the present invention.

FIG. 5A is a cross sectional view of a focusing particle trap 500 in accordance with an aspect of the present invention. The particle trap 500 is operable on ion beams, such as an exemplary elliptical ion beam 502, and selectively removes particles from ion beams while also focusing ion beams in order to mitigate space charge blow up and the like. The focusing particle trap 500 is exemplary in nature and it is appreciated that variations thereof are contemplated and in accordance with the present invention.

The exemplary ion beam 502, in this example, has an approximately elliptical shape and is thus narrower in an x-direction (horizontal) than a y-direction (vertical). Such ion beams can be susceptible to space charge blow up in x and y directions. The lens geometry should accommodate the beam size and shape at the lens and, in this example, is taller than it is wide. The space charge blow up in the x-direction can be mitigated by employing higher voltages, which result in stronger x-focusing due to electrostatic focusing in the narrow dimension of the lens. Space charge blow up in the y-direction is not substantially reduced in this manner because electrostatic focusing is weak along most of the tall dimension. As a result, the particle trap 500 employs electrodes with curved surfaces that mitigate such problems in the y direction. The curvature provides a field with a vertical component toward the center of the beam, and this in turn provides focusing in the y direction.

The particle trap 500 comprises an entrance electrode 504, a center electrode 508, and an exit electrode 512. The entrance electrode 504 is comprised of a conductive material and comprises an aperture 506 through which the exemplary ion beam 502 travels. The entrance electrode 504 comprises a relatively flat first surface and a concave second surface facing the center electrode 508. The entrance aperture 506 is shaped such that the ion beam 502 can substantially pass there through. The entrance electrode 504 is biased to a lower in magnitude or more positive voltage than the center electrode 508, such as ground or 0 V, for example.

The center electrode 508 is positioned downstream of the entrance electrode 504 and is also comprised of a conductive material and comprises a center aperture 510 through which the exemplary ion beam 502 travels after passing through the entrance aperture 506. The center electrode 508 has a first convex surface facing the entrance electrode 504 and a second flat surface facing the exit electrode 512, for example. The center electrode 508 is biased to a negative voltage, such as −17 kV, more negative than that of the entrance electrode 504. As a result, a first electric field 518 is created directed from the entrance electrode 504 toward the center electrode 508. The first electric field 518 initially accelerates the ion beam 502 from the entrance electrode 504 to the center electrode 508.

The concave second surface of entrance electrode 504 and the convex first surface of center electrode 508 can be shaped so as to produce an ion beam that has a size and shape appropriate for increasing beam transmission through downstream apertures and for implanting the workpiece, when a voltage or range of voltages applied to center electrode 508 is appropriate for trapping particles in a desired range of sizes. The surface shapes of a lens exerts vertical focusing, for example, as opposed to horizontal focusing.

The exit electrode 512 is positioned downstream of the center electrode 508 and is substantially parallel to both the center electrode 508 and the entrance electrode 504. In this exemplary aspect, the exit electrode 512 has a relatively flat/planar first surface facing toward the center electrode 508 and a second relatively flat second surface facing away from the center electrode 508. Additionally, the exit electrode 512 is comprised of a conductive material and comprises an exit aperture 514 through which the exemplary ion beam 502 travels after passing through the center aperture 510. The exit electrode 512 is biased to a more positive value, such as ground or zero volts. As a result, a second electric field 530 is generated directed from the exit electrode 512 towards the center electrode 508. The second electric field 530 causes the ions and particles within the beam 502 (having a positive charge) to decelerate. The particles, because of their increasing positive charge, are decelerated to a greater extent. Additionally, it is appreciated that the first and second surfaces of the electrodes (504, 508, and 512) can have shapes varied from that described above and depicted in FIG. 5A in order to compensate for varied ion beam shapes. The curvature of the center and exit surfaces that face each other can also be curved to achieve vertical focusing, either alone or in combination with curvature on the entrance and center apertures. Also the curvature of any electrode could be made variable or selectable to optimize vertical and horizontal focusing.

The operation of the particle trap 500 is substantially similar to that of the particle trap 200 of FIG. 2. Again, the ion beam 502 is comprised of positively charged ions, but has a relatively approximately elliptical shape longer in the y-direction. Additionally, unwanted particles are also contained within the ion beam 502. The particles are typically initially neutral and relatively stationary and also are generally larger than ions within the ion beam 502 by several orders of magnitude. As positively charged ions collide with the particles, they become positive and tend to move downstream in the direction of the ion beam 502. Because the particles generally have a much greater mass than the ions, the particles can accumulate a much greater positive charge than the ions within the ion beam 502. However, the velocity of the unwanted particles is still substantially less than that of the ions within the ion beam 502.

FIG. 5B is a cross sectional view of another exemplary focusing particle trap 530 in accordance with yet another aspect of the present invention. The particle trap 530 is operable on ion beams, such as an exemplary elliptical ion beam 534 illustrated herein as a rectangle, and selectively removes particles from the ion beam 534 while also focusing the ion beam 534 in order to mitigate space charge blow up, and the like. The focusing particle trap 530 is exemplary in nature and it is appreciated that variations thereof are contemplated and in accordance with the present invention.

The exemplary ion beam 502, in this example, has an approximately elliptical shape and is thus narrower in an x-direction (horizontal direction) than a y-direction (vertical direction). Such an ion beam 534 can be susceptible to space charge blow up in the x and y directions, for example. The space charge blow up in the x-direction can be mitigated by employing higher voltages, which result in stronger x-focusing, but space charge blow up in the y-direction is not substantially reduced in this manner because the slit lens approximation does not hold in the larger direction of a slit lens. As a result, the exemplary particle trap 530 employs electrodes with curved surfaces that mitigate such problems in the y direction.

The particle trap 530 comprises an entrance electrode 536, a center electrode 540, and an exit electrode 534. The entrance electrode 536 is comprised of a conductive material and comprises an aperture 538 through which the exemplary ion beam 534 travels, for example. The entrance electrode 536 comprises a relatively flat first surface and a relatively flat second surface facing the center electrode 540. The aperture 538 can be shaped such that the ion beam 534 can substantially pass therethrough, for example. The entrance electrode 536 is biased to a lower in magnitude or more positive voltage than the center electrode 540, such as ground or 0 V.

The center electrode 540 is positioned downstream of the entrance electrode 536 and is also comprised of a conductive material and comprises a center aperture 542 through which the exemplary ion beam 534 travels after passing through the entrance aperture 538. The center electrode 540 has a first flat surface facing the entrance electrode 536 and a second convex surface facing the exit electrode 534, for example. The center electrode 540 can be biased to a negative voltage, such as −17 kV, for example, more negative than that of the entrance electrode 536. As a result, a first electric field 550 is created directed from the exit electrode 536 toward the center electrode 540. The electric field 551 initially accelerates the ion beam 534 from the entrance electrode 536 to the center electrode 540.

The exit electrode 534 is positioned downstream of the center electrode 540 and is substantially parallel to both the center electrode 540 and the entrance electrode 536. In this exemplary aspect, the exit electrode 534 has a concave first surface facing toward the center electrode 540 and a second convex surface facing away from the center electrode 540. Additionally, the exit electrode 534 is comprised of a conductive material and comprises an exit aperture 536 through which the exemplary ion beam 534 travels after passing through the center aperture 542. The exit electrode 534 is biased to a more positive value, such as ground or zero volts, for example. As a result, a second electric field 542 is generated directed from the exit electrode 534 towards the center electrode 540. The second electric field 542 causes the ions and particles within the beam 534 (having a positive charge) to decelerate, for example. The particles, because of their higher positive charge, are decelerated to a greater extent than the ions. Additionally, it is appreciated that the first and second surfaces of the electrodes (536, 540, and 534) can have shapes varied from that described above and depicted in FIG. 5B in order to compensate for varied ion beam shapes. The curvature of the center and exit surfaces that face each other can also be curved to achieve vertical focusing, either alone or in combination with curvature on the entrance and center apertures. Also the curvature of any electrode could be made variable or selectable to optimize vertical and horizontal focusing.

The operation of the particle trap 530 in FIG. 5B is substantially similar to that of the particle trap 500 of FIG. 5A. Again, the ion beam 534 is comprised of positively charged ions, but has a relatively elliptical shape longer in the y-direction. Additionally, unwanted particles, such as photoresist residue and the like, are also contained within the ion beam 534. The particles are typically and initially neutral and relatively stationary and also are generally larger than ions within the ion beam 534 by several orders of magnitude. As positively charged ions collide with the particles, they become positive and tend to move downstream in the direction of the ion beam 534. Because the particles generally have a much greater mass than the ions, the particles can accumulate a much greater positive charge than the ions within the ion beam 534. However, the velocity of the unwanted particles is still substantially less than that of the ions within the ion beam 534.

FIG. 5C is another cross sectional view of an exemplary focusing particle trap 560 in accordance with yet another aspect of the present invention. The particle trap 560 is operable on ion beams, such as an exemplary elliptical ion beam 562 illustrated herein as a rectangle, and selectively removes particles from the ion beam 562 while also focusing the ion beam 562 in order to mitigate space charge blow up, and the like. The focusing particle trap 560 is exemplary in nature and it is appreciated that variations thereof are contemplated and in accordance with the present invention.

The exemplary ion beam 562, in this example, also has an elliptical shape and is thus narrower in an x-direction (horizontal direction) than a y-direction (vertical direction). It should be appreciated that various other ion beam shapes are contemplated herein, for example, rectangular, irregular shapes, etc., and all are contemplated herein. Such an ion beam 562 can be susceptible to space charge blow up in the x and y directions, for example. The space charge blow up in the x-direction can be mitigated by employing higher voltages, which result in stronger x-focusing, but space charge blow up in the y-direction is not substantially reduced in this manner because the slit lens approximation does not hold in the larger direction of a slit lens. As a result, the exemplary particle trap 560 employs electrodes with curved surfaces that mitigate such problems in the y-direction.

The particle trap 560 comprises an entrance electrode 564, a center electrode 568, and an exit electrode 572. The entrance electrode 564 is comprised of a conductive material and comprises an aperture 566 through which the exemplary ion beam 562 travels, for example. The entrance electrode 564 comprises a relatively flat first surface and a relatively concave second surface facing the center electrode 558. The aperture 566 can be shaped such that the ion beam 562 can substantially pass there through, for example. The entrance electrode 564 is biased to a lower in magnitude or more positive voltage than the center electrode 568, such as ground or 0 V.

The center electrode 568 is positioned downstream of the entrance electrode 564 and is also comprised of a conductive material and comprises a center aperture 570 through which the exemplary ion beam 562 travels after passing through the entrance aperture 566. The center electrode 568 has a first concave surface facing the entrance electrode 564 and a second concave surface facing the exit electrode 572, for example. The center electrode 568 as discussed supra, can be biased to a negative voltage, for example, more negative than that of the entrance electrode 564. As a result, a first electric field 578 is created directed from the entrance electrode 564 toward the center electrode 568. The first electric field 570 initially accelerates the ion beam 562 from the entrance electrode 564 to the center electrode 568.

The exit electrode 572 is positioned downstream of the center electrode 568 and is substantially parallel to both the center electrode 568 and the entrance electrode 564. In this exemplary aspect, the exit electrode 572 has a concave first surface facing toward the center electrode 568 and a second approximately flat surface facing away from the center electrode 568. Additionally, the exit electrode 572 is comprised of a conductive material and comprises an exit aperture 574 through which the exemplary ion beam 562 travels after passing through the center aperture 570. The exit electrode 572 is biased to a more positive value, such as ground or zero volts, for example. As a result, a second electric field 579 is generated directed from the exit electrode 572 towards the center electrode 568. The second electric field 579 causes the ions and particles within the beam 562 (having a positive charge) to decelerate, for example. The particles, because of their higher positive charge, are decelerated to a greater extent than the ions. Additionally, it is appreciated that the first and second surfaces of the electrodes (564, 568, and 572) can have shapes varied from that described above and depicted in FIG. 5B in order to compensate for varied ion beam shapes. The curvature of the center and exit surfaces that face each other can also be curved to achieve vertical focusing, either alone or in combination with curvature on the entrance and center apertures. Also the curvature of any electrode could be made variable or selectable to optimize vertical and horizontal focusing.

The operation of the particle trap 560 in FIG. 5C is substantially similar to that of the particle trap 530 of FIG. 5B. Again, the ion beam 562 is comprised of positively charged ions, but can have a relatively elliptical shape longer in the y-direction, in this embodiment.

Figure 6A:
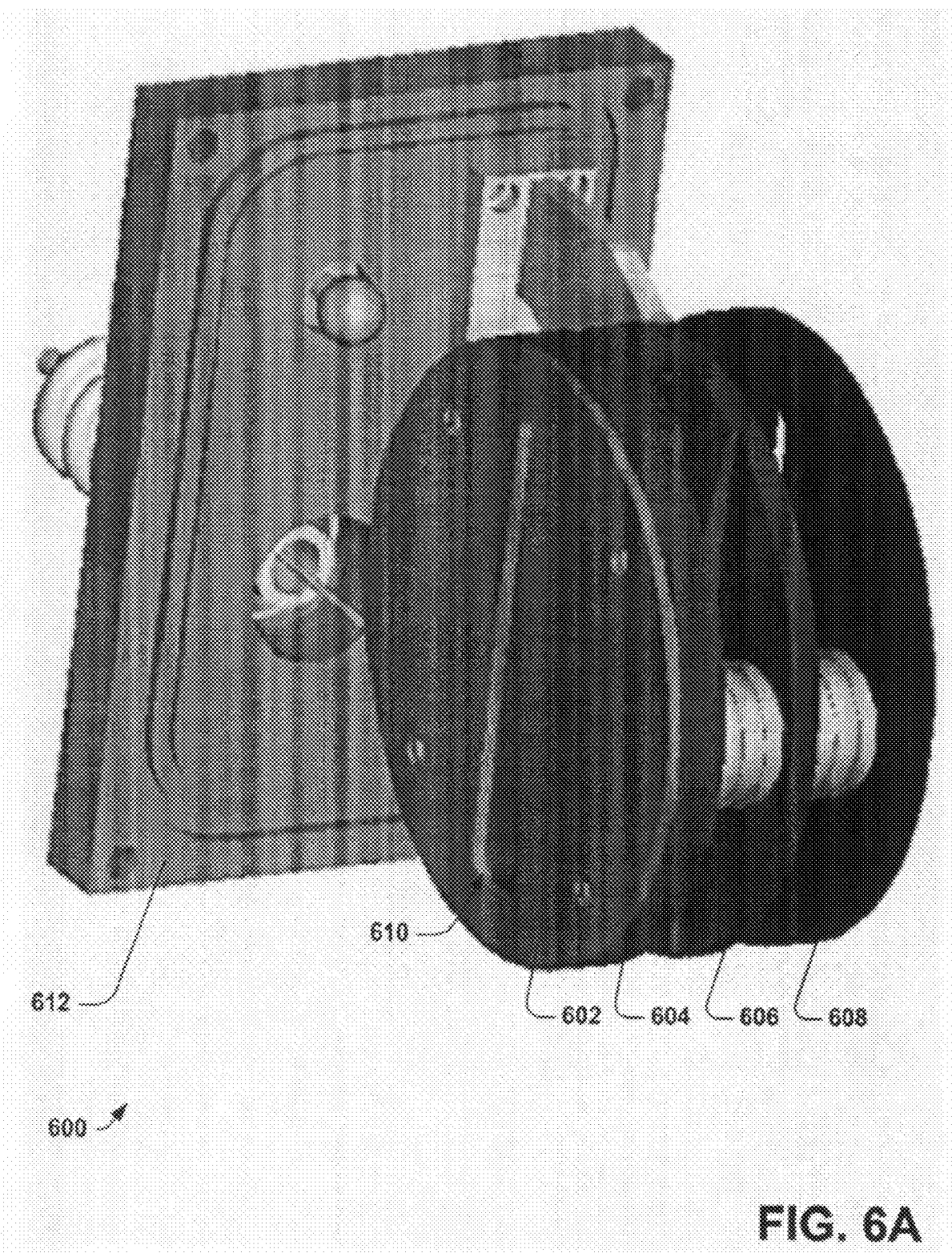
FIG. 6A is a perspective view of an exemplary implementation of a focusing particle trap in accordance with an aspect of the present invention.

FIGS. 6A and 6B depict an exemplary focusing particle trap 600 in accordance with an aspect of the present invention. The particle trap 600 is exemplary in nature and is provided to illustrate one possible configuration and assembly of a focusing particle trap in accordance with the present invention. It is appreciated that other assemblies and configurations can be employed with the present invention.

FIG. 6A is a perspective view of an exemplary implementation of the focusing particle trap 600 in accordance with an aspect of the present invention. The particle trap 600 comprises an entrance electrode 604, a center electrode 606, and an exit electrode 608 and is affixed to a mount 612 for placement within or about a beam line assembly of an ion implantation system (not shown). The particle trap 600 operates substantially similar to that of the particle trap 500 of FIG. 5A.

Gaps are shown between the entrance electrode 604 and the center electrode 606 and between the center electrode 606 and the exit electrode 608. A front plate 602 is mounted to a first surface of the entrance electrode 604. The front plate 602 includes an aperture 610 aligned with an aperture of the entrance electrode 604. Apertures (not visible) are also present in the center electrode 606 and the exit electrode 608, through which ion beams pass. One or more power supplies are electrically connected to the electrodes 604, 606, and 608 in order apply appropriate voltage biases. A control system can be utilized as a part of the electrostatic particle trap such that the voltages on the electrodes can be selectively varied based upon monitoring beam current and particles within the ion beam, for example. In other words, the particle trap could employ a particle feedback system that is open loop or closed loop. The open loop system would employ sensors or systems to measure the beam current and estimate the number of particle impacting the workpiece, for example. Therefore the system could be tuned for the next implant process by biasing the voltage that is applied to the electrodes. In addition, this approach could be used, for example, in an in situ particle monitoring process, and all such processes known by those of ordinary skill in the art are contemplated here.

FIG. 6B is an exploded perspective view of the focusing particle trap 600 in accordance with an aspect of the present invention. This view more clearly shows the individual electrodes and exemplary shapes. This view illustrates the plate 602, the entrance electrode 604, the center electrode 606, and the exit electrode 608 in more detail.

The entrance electrode 604 is shown in two pieces in order to more fully illustrate the present invention. A second surface 614 of the entrance electrode 604 is concave in order to mitigate divergence along a y-direction. Similarly, a first surface 616 of the center electrode 606 is convex in order to mitigate divergence along the y-direction. The aperture 610 and apertures of the electrodes 604, 606, and 608 can be seen shaped to accommodate an elliptical shaped ion beam.

Figure 7:
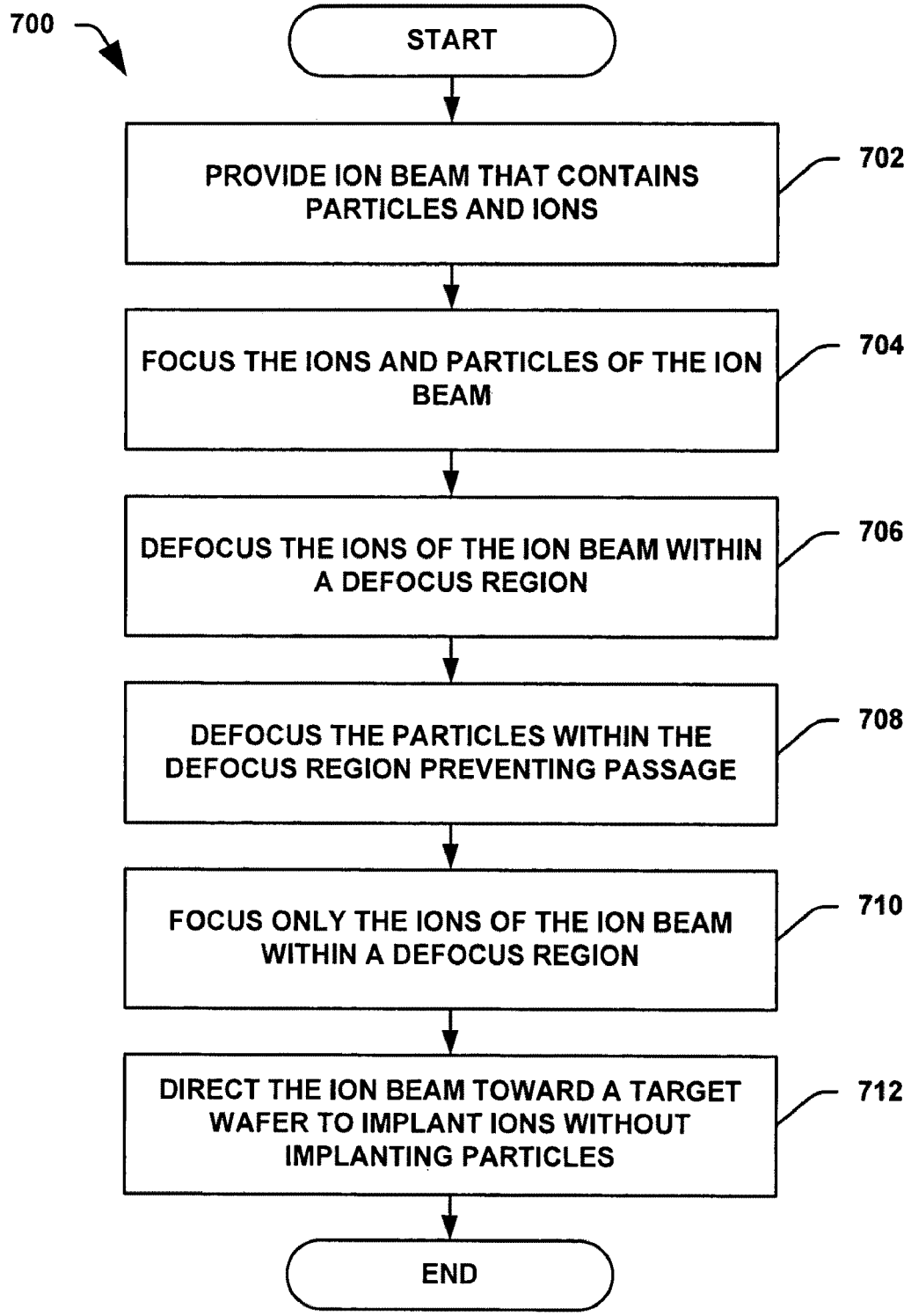
FIG. 7 is a flow diagram illustrating a method of removing particles from an ion beam and focusing an ion beam in accordance with an aspect of the present invention.

FIG. 7 is a flow diagram illustrating a method 700 of removing particles from an ion beam and focusing an ion beam in accordance with an aspect of the present invention. The method 700 employs a focusing particle trap that comprises a de-focus region that results in removing particles from the ion beam and typically operates within an ion implantation system. As a result, performance of the ion implantation process is facilitated and undesired implanting of particles is mitigated.

The method 700 begins at block 702, wherein an ion beam that may comprise unwanted particles within the ion beam is provided. The particles become present within the ion beam and are pushed along downstream with the ion beam by individual ions striking the particles. Additionally, the ions within the ion beam carry a positive charge which causes the particles to become positively charged. Furthermore, the particles have a larger mass and thus, tend to accumulate more charge and become more positively charged than the ions within the beam.

The ion beam and the particles at 702 are initially focused by a focus portion of a first electrostatic field at block 704. The first electrostatic field is created by applying appropriate voltage biases to an entrance electrode having an entrance aperture and a center electrode having a center aperture, through which the ion beam passes. The entrance electrode and aperture and the center electrode and aperture are shaped such that the first electrostatic field, directed from the entrance electrode toward the center electrode provides desired focusing and defocusing in both x and y directions and also accommodate a shape of the ion beam, such as pencil or ribbon shapes. Additionally, the field strength can be adjusted by appropriately biasing the center electrode to a negative voltage whereas the entrance electrode is typically biased to about ground. The focus portion of the first electrostatic field begins at the entrance electrode and ends about halfway toward the center electrode. Additionally, positive charge accumulates on the particles during the focus portion due to electrons within the beam being repelled by the negatively biased center electrode.

Subsequently, the ion beam is defocused by a defocus region comprised of a defocus portion of the first electrostatic field and a defocus portion of a second electrostatic field at block 706. A second electrostatic field is generated by applied biases to the center electrode and an exit electrode having an exit aperture through which the ion beam passes through. The exit electrode and aperture and the center electrode and aperture are shaped such that the second electrostatic field, directed from the entrance electrode toward the center electrode provides desired focusing and defocusing in both x and y directions and also accommodate a shape of the ion beam, such as pencil or ribbon shapes. Additionally, the field strength can be adjusted by appropriately biasing the center electrode to a negative voltage whereas the exit electrode is typically biased to about ground.

The second electrostatic field comprises the defocus portion that begins at the center electrode and continues about halfway downstream toward the exit electrode. At this point, focusing starts at a focus portion of the second electrostatic field, which continues until the exit electrode is reached.

Concurrently, the particles are substantially defocused by the defocus region comprised of the defocus portion of the first electrostatic field and the defocus portion of a second electrostatic field causing the particles to orbit within the defocus region at block 708. The particles have a much greater mass and positive charge than the ions within the beam and, as a result, are more easily diverted or defocused away from the ion beam path. As a consequence, the particles tend to orbit within the defocus region and continue to accumulate positive charge until exiting the ion beam and impacting upon an object, such as the center electrode.

The ion beam is then focused by the focus portion of the second electrostatic field at block 710. The particles, or at least a portion of the particles, have been removed before the ion beam enters the focus portion of the second electrostatic field. As a result, substantially only the ions within the ion beam are focused in x and y directions.

The ion beam is directed toward a target wafer, for example causing ions within the ion beam to be implanted in the target wafer at block 712. At least a portion of the particles have been removed, so the implant is performed with more uniformity and less contamination from the particles. As a result, more uniform device operation and better performance can be obtained.

It is appreciated that the method 700, as well as variations thereof, can be further appreciated with reference to other figures of the present invention. Additionally, the method 700 and description thereof can also be employed to facilitate a better understanding of other aspects of the invention described previously.

While, for purposes of simplicity of explanation, the method 700 is depicted and described as executing serially, it is to be understood and appreciated that the present invention is not limited by the illustrated order, as some aspects could, in accordance with the present invention, occur in different orders and/or concurrently with other aspects from that depicted and described herein.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion implantation system comprising:
    an ion beam source that generates an ion beam;
    a beam line assembly that receives the ion beam from the ion beam source comprising:
        a mass analyzer that selectively passes selected ions;
        a focusing electrostatic particle trap that receives the ion beam and removes particles from the ion beam comprising:
            an entrance electrode comprising an entrance aperture and biased to a first base voltage;
                wherein the first surface of the entrance electrode is facing away from a center electrode and is approximately flat;
                wherein the second surface of the entrance electrode is facing toward the center electrode and is concave;
                wherein the center electrode is positioned a distance downstream from the entrance electrode comprising a center aperture and biased to a center voltage, wherein the center voltage is less than the first base voltage;
                wherein the first surface of the center electrode is facing toward the entrance electrode and is convex;
                wherein the second surface of the center electrode is facing away from the entrance electrode and is approximately flat;
            an exit electrode positioned a distance downstream from the center electrode comprising an exit aperture and biased to a second base voltage; and
                wherein the first surface of the exit electrode is facing toward the center electrode and is approximately flat;
                wherein the second surface of the exit electrode is facing away from the center electrode and is approximately flat;
            wherein a first electrostatic field is generated from the entrance electrode toward the center electrode and a second electrostatic field is generated from the exit electrode toward the center electrode; wherein the second base voltage is greater than the center voltage; and
    an end station that is downstream from the beam line assembly and receives the ion beam.

2. The system of claim 1, wherein the center voltage of the center electrode is set according to size and velocity of the particles.

3. The system of claim 1, wherein the voltage for the center electrode is at a lower potential than the first base voltage, and a lower potential than the second base voltage.

4. The system of claim 1, wherein the entrance aperture, the center aperture, and the exit aperture are approximately elliptically shaped.

5. The system of claim 1, wherein the entrance aperture, the center aperture, and the exit aperture are rectangular shaped.

6. The system of claim 1, wherein an acceleration/deceleration component accelerates the ions within the ion beam to a desired momentum.

7. The system of claim 1, wherein the first electrostatic field comprises a horizontal focus portion beginning at about the entrance electrode and ending at a midpoint between the center electrode and the entrance electrode and the second electrostatic field comprising a horizontal defocus portion beginning at about the midpoint between the center electrode and exit electrode and ending at about the center electrode.

8. The system of claim 1, wherein the first surface of the entrance electrode is approximately flat and the second surface of the entrance electrode is approximately flat;

wherein the first surface of the center electrode is approximately flat and the second surface of the center electrode is convex;
wherein the first surface of the exit electrode is concave and the second surface of the exit electrode is approximately flat; and
the electrode surfaces provide vertical focusing.

9. The system of claim 1, wherein the first surface of the entrance electrode is approximately flat and the second surface of the entrance electrode is concave;
wherein the first surface of the center electrode is convex and the second surface of the center electrode is convex;
wherein the first surface of the exit electrode is convex and the second surface of the exit electrode is approximately flat; and
the electrode surfaces provide vertical focusing.

10. The system of claim 8, wherein the horizontal focus portion of the first electrostatic field and the horizontal defocus portion of the second electrostatic field comprise a region in which the particles orbit and become trapped.

11. A focusing particle trap system for ion implantation comprising:
an entrance electrode comprising an entrance aperture and biased to a first base voltage;
a center electrode positioned a distance downstream from the entrance electrode comprising a center aperture and biased to a center voltage;
an exit electrode positioned a distance downstream from the center electrode comprising an exit aperture and biased to a second base voltage, wherein the first base voltage and the second base voltage are greater than the center voltage; and
wherein a first electrostatic field is generated from the entrance electrode toward the center electrode and a second electrostatic field is generated from the exit electrode toward the center electrode,
wherein the first surface of the entrance electrode is facing away from a center electrode and is approximately flat;
wherein the second surface of the entrance electrode is facing toward the center electrode and is concave;
wherein the first surface of the center electrode is facing toward the entrance electrode and is convex;
wherein the second surface of the center electrode is facing away from the entrance electrode and is approximately flat;
wherein the first surface of the exit electrode is facing toward the center electrode and is approximately flat; and
wherein the second surface of the exit electrode is facing away from the center electrode and is approximately flat; and
the electrode surfaces provide vertical focusing.

12. The system of claim 11, wherein the center voltage for the center electrode is less than the first base voltage or the second base voltage.

13. The system of claim 11, wherein an ion beam comprising selected ions and particles passes through the entrance aperture, the center aperture, and the exit aperture.

14. The system of claim 11, wherein the first surface of the entrance electrode is approximately flat and the second surface of the entrance electrode is approximately flat;
wherein the first surface of the center electrode is approximately flat and the second surface of the center electrode is convex;
wherein the first surface of the exit electrode is concave and the second surface of the exit electrode is approximately flat; and
the electrode surfaces provide vertical focusing.

15. The system of claim 11, wherein the first surface of the entrance electrode is approximately flat and the second surface of the entrance electrode is concave;
wherein the first surface of the center electrode is convex and the second surface of the center electrode is convex;
wherein the first surface of the exit electrode is convex and the second surface of the exit electrode is approximately flat; and
the electrode surfaces provide vertical focusing.

16. The system of claim 11, wherein the first electrostatic field comprises a horizontal focus portion beginning at about the entrance electrode and ending at a midpoint between the center electrode and the entrance electrode and a horizontal defocus portion beginning at about the midpoint between the center electrode and ending at about the center electrode and wherein the second electrostatic field comprises a horizontal defocus portion beginning at about the center electrode and ending at a midpoint between the center electrode and the exit electrode and a horizontal focus portion beginning at about the midpoint between the center electrode and ending at about the exit electrode.

17. The system of claim 16, wherein the horizontal defocus portion of the first electrostatic field and the horizontal defocus portion of the second electrostatic field comprise a defocus region in which the particles orbit and become trapped.

18. The system of claim 17, wherein the horizontal focus portion of the second electrostatic field selectively focuses mostly ions within an ion beam.

19. A method of focusing an ion beam and trapping particles within the ion beam comprising:
providing an ion beam having particles and ions within the ion beam;
focusing horizontally the ion beam within a first horizontal focus region;
defocusing horizontally the ions within the ion beam within a horizontal defocus region;
trapping the particles within the horizontal defocus region by defocusing horizontally the particles of the ion beam to remove the particles from the ion beam; and
focusing horizontally mainly the ions of the ion beam within a second horizontal focus region.

20. The method of claim 19, wherein a first surface of an entrance electrode is approximately flat and a second surface of the entrance electrode is concave;
wherein a first surface of a center electrode is convex and a second surface of the center electrode is approximately flat;
wherein a first surface of the exit electrode is approximately flat and a second surface of the exit electrode is approximately flat; and
the electrode surfaces provide vertical focusing.

21. The method of claim 19, wherein a first surface of an entrance electrode is approximately flat and a second surface of the entrance electrode is approximately flat;
wherein a first surface of a center electrode is approximately flat and a second surface of the center electrode is convex;
wherein a first surface of the exit electrode is concave and a second surface of the exit electrode is approximately flat; and
the electrode surfaces provide vertical focusing.

22. The method of claim 19, wherein a first surface of an entrance electrode is approximately flat and a second surface of the entrance electrode is concave;
- wherein a first surface of a center electrode is convex and a second surface of the center electrode is convex;
- wherein a first surface of the exit electrode is concave and a second surface of the exit electrode is approximately flat; and
- the electrode surfaces provide vertical focusing.

23. The method of claim 19, further comprising generating a first electrostatic field between an entrance electrode and a center electrode comprising a horizontal focus portion and a horizontal defocus portion, wherein the horizontal focus portion defines the first horizontal focus region.

24. The method of claim 19, further comprising generating a second electrostatic field between the center electrode and an exit electrode comprising a horizontal defocus portion and a horizontal focus portion, wherein the horizontal defocus portion of the first electrostatic field and the horizontal defocus portion of the second electrostatic field define the horizontal defocus region, and wherein the horizontal focus portion of the second electrostatic region defines the second horizontal focus region.

25. The method of claim 19, wherein generating the first electrostatic field comprises biasing the entrance electrode to ground voltage and the center electrode to a negative voltage.

26. The method of claim 19, wherein the provided ion beam has an approximately elliptical shape.

27. The method of claim 19, further comprising directing the ion beam with a reduced number of particles toward a target wafer.

28. The method of claim 19, a control system can be utilized within the electrostatic particle trap to adjust the voltages on the entrance electrode; the center electrode and the exit electrode.

29. The method of claim 28, wherein the voltage on the entrance electrode, the center electrode and the exit electrode can be selectively varied based upon a particle feedback system monitoring particles within the ion beam.

30. The method of claim 29, wherein the particle feedback system is open loop or closed loop.

31. The method of claim 30, wherein the open loop system would employ sensors or detection systems to determine the number of particle impacting the workpiece.

32. The method of claim 30, wherein the open loop system or closed loop system is tuned for the next implant process by biasing the voltage that is applied to the electrodes based upon data from the particle feedback system.

33. The method of claim 30, wherein the particle feedback system is utilized in an in situ particle monitoring process.

* * * * *